United States Patent [19]

Eyuboglu

[11] Patent Number: 5,428,646
[45] Date of Patent: Jun. 27, 1995

[54] DEVICE AND METHOD FOR FRAME SYNCHRONIZATION IN A MULTI-LEVEL TRELLIS CODING SYSTEM

[75] Inventor: M. Vedat Eyuboglu, Concord, Mass.
[73] Assignee: Motorola, Inc., Schaumburg, Ill.
[21] Appl. No.: 996,454
[22] Filed: Dec. 24, 1992
[51] Int. Cl.[6] .............................................. H04L 7/00
[52] U.S. Cl. .................................. 375/354; 375/340; 371/5.4; 371/42; 371/46
[58] Field of Search ................... 375/20, 39, 106, 108, 375/94, 113, 114; 371/5.4, 37.1, 37.6, 37.7, 42, 43, 46, 47.1, 50.1; 370/105.1

[56] References Cited

U.S. PATENT DOCUMENTS

| | | | |
|---|---|---|---|
| 4,807,230 | 2/1989 | Srinivasagopalan et al. | 371/42 |
| 4,967,413 | 10/1990 | Otani | 371/37.7 |
| 5,014,275 | 5/1991 | Shimoda et al. | 371/43 |

OTHER PUBLICATIONS

British Telecom, "A frame synchronization technique for V.fast," Contribution D145, CCITT Study Group XVII, Geneva, Oct. 1991.
Motorola Information Systems, "Four-dimensional multi-level codes for V.fast," Contribution 140, CCITT V.fast Rapporteurs Meeting, Ft. Lauderdale, Fla., Feb. 1992.
Motorola Information Systems, "Four-dimensional multi-level codes for V.fast," Contribution TR30.1/92-02040, TR 30.1, Huntsville, Ala., May 1992.
Rockwell International, "A frame synchronization method for V.fast," Contribution M135, CCITT V.fast Rapporteurs Meeting, Munich, Germany, Jun. 1992.
US Robotics, "V.fast frame synchronization for fractional bit signalling," Contribution M137, CCITT V.fast Rapporteurs Meeting, Munich, Germany, Jun. 1992.
British Telecom, "Requirements for a V.fast synchronization procedure," Contribution Bath-32, CCITT V.fast Rapporteurs Meeting, Bath, England, Sep. 1992.
British Telecom, "On the performance of synchronization schemes," Contribution Bath-32, CCITT V.fast Rapporteurs Meeting, Bath, England, Sep. 1992.
IBM and Motorola Information Systems, "16-32-and 64-state codes for 4-D TCM with 2 SPC's," CCITT V.fast Rapporteurs Meeting, Bath, England, Sep. 1992.
L.-F. Wei, "Trellis-coded modulation using multi-dimensional constellations," IEEE Trans. Inform. Theory, vol. IT-33, pp. 483-501, Jul. 1987.
G. J. Pottie and D. P. Taylor, "Multilevel codes based on partitioning," IEEE Trans. Inform. Theory. vol. 35, pp. 87-98, Jan. 1989.

*Primary Examiner*—Stephen Chin
*Assistant Examiner*—Don Vo
*Attorney, Agent, or Firm*—Darleen J. Stockley

[57] ABSTRACT

The device (100) and method (700) of the present invention provides for detecting and correcting loss of frame synchronization in a communication system with multi-level trellis coding without additional allocation of channel capacity for such detection and correction.

6 Claims, 4 Drawing Sheets

DEVICE AND METHOD FOR FRAME SYNCHRONIZATION IN A MULTI-LEVEL TRELLIS CODING SYSTEM

FIELD OF THE INVENTION

The present invention relates to digital data transmission and more particularly to frame synchronization in a multi-level trellis-coded communication system.

BACKGROUND

In recent years several multi-dimensional trellis codes have been discovered which provide a better performance against Gaussian noise than two-dimensional trellis codes of similar complexity. These trellis codes have minimum-distance error patterns which are only one or two symbol intervals long. (In what follows, unless indicated otherwise, symbols are assumed to be two-dimensional.) When noise has a Gaussian distribution, the performance of the trellis code is determined by a minimum-distance of the trellis code, and the lengths of the minimum-distance error patterns do not directly affect the performance.

However, when the noise probability density exhibits long tails (signifying a high probability for large noise peaks), the performance can be noticably degraded when minimum-distance error patterns are very short. For such noise, the advantage of multi-dimensional trellis codes may be lost. In practice, large noise peaks may be caused by impulsive noise or by signal-dependent impairments such as non-linear distortion or pulse code modulation (PCM) noise found in the analog public switched telephone network.

In multi-dimensional trellis codes, short minimum-distance error patterns are created by parallel transitions in the trellis diagram. A method which is known in the art as multi-level coding can eliminate these short minimum-distance error patterns. In multi-level coding, extra parity bits are added in the transmitter so that the receiver can detect and correct parallel transition errors. A special form of multi-level coding involves single parity-check (SPC) block codes. With multi-level coding, a synchronized receiver can detect minimum-distance parallel transition errors, as long as there is only one type of error per SPC frame.

In data transmission systems, it is often necessary to maintain symbol frame synchronization between transmitting and receiving modems. In what follows, this will be called primary frame synchronization. Primary frame synchronization is necessary, for example, in data transmission systems that employ multiplexers. A transmission system in which a fractional number of bits must be transmitted per symbol (on the average) is another example of a system that requires symbol frame synchronization. In a system utilizing multi-level trellis coding with SPC's, the primary frame size may be different from the length of the SPC code.

In practice, primary frame synchronization is established prior to data transmission using a preamble or training sequence. However, during data transmission primary frame synchronization may be lost due to a sudden change in the channel delay between the transmitter and receiver. It is important that during data reception such loss of primary frame synchronization be quickly detected. In a commonly used technique, known frame synchronization bits (frame sync bits) are added at primary frame boundaries at the transmitter using time-division multiplexing. In the receiver, a frame synchronization loss detector checks whether the bits received in the designated primary frame boundaries correspond to the frame sync bits. When this check fails more than a predetermined number of times over a predetermined period of time, a loss of frame synchronization is declared. A disadvantage of this technique is that a portion of the channel capacity must be allocated for frame synchronization to transmit the frame sync bit.

Thus, there is a need for quickly detecting and correcting a loss of frame synchronization in a communication system that uses multi-level trellis coding.

SUMMARY

A device and method are provided for facilitating frame synchronization in a communication system wherein a transmitter sends a sequence of signal points using multilevel trellis coding with at least one parity-check code. The sequence of signal points being organized as a series of frames of fixed length, and wherein the receiver must maintain frame synchronization with said transmitter. The receiver comprises at least: a decoder, operably coupled to receive said sequence, for estimating the transmitted signal points, and means for detecting and monitoring rate of occurrences of parity failures in the said parity-check code of the multi-level code, and means for outputting information about frame synchronization based on the rate of occurrences of parity failure.

DETAILED DESCRIPTION OF A PREFERRED EMBODIMENT

In this invention parity check bits which are present in a multi-level trellis coded communication system are utilized to detect and correct loss of symbol frame synchronization. This allows rapid and accurate detection of loss of frame synchronization without any additional performance penalty.

Trellis coded modulation systems were developed to encode digital data as a sequence from a set of allowable sequences of signal points so that error performance of synchronous data links could be improved without decreasing data rate or requiring greater bandwidth.

Allowable sequences are selected such that the minimum squared distance between the sequences is greater than the minimum squared distance between the signal points in the constellation. Signal points of each code sequence are interdependent, and not all possible sequences are allowable. A net coding gain is obtained since the additional average power used to send the code redundancies is less than the increase in minimum squared sequence distance.

Figure 1:
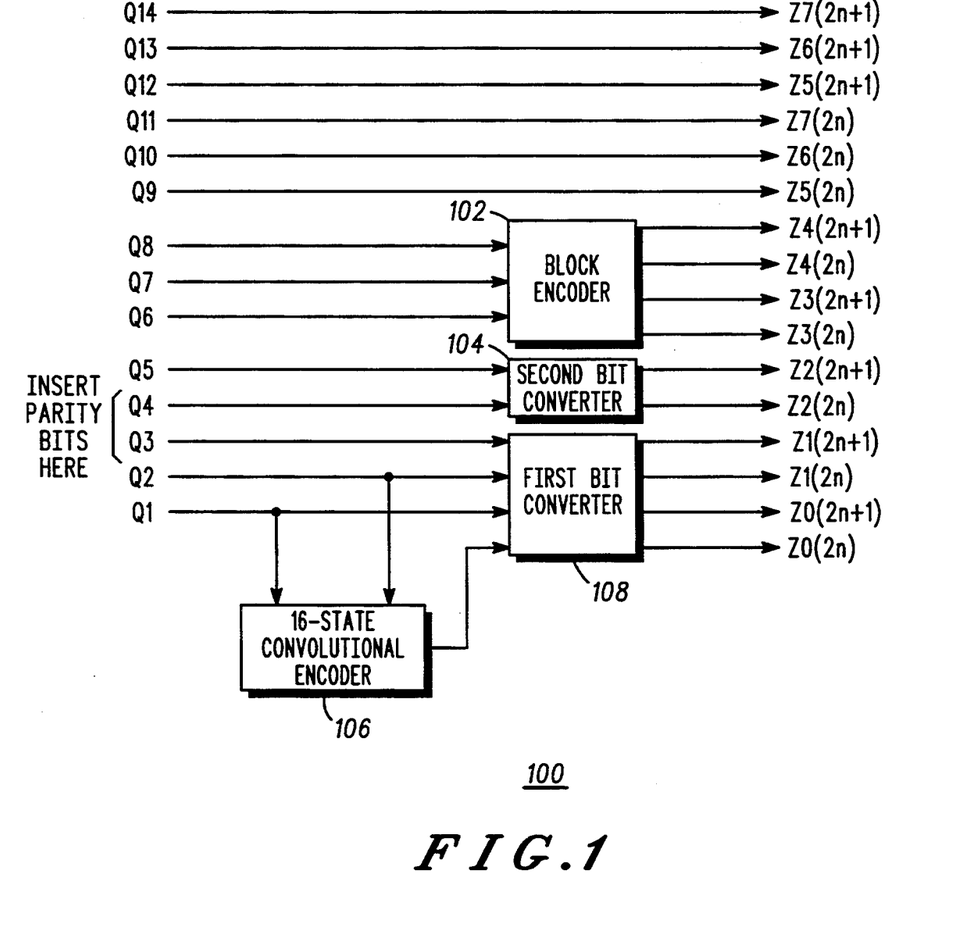
FIG. 1 is a block diagram of a multi-level trellis encoder in a communication system in accordance with a first embodiment of the present invention.

FIG. 1, numeral 100, is a block diagram of a trellis encoder typically utilized in a transmitter for encoding data sequences for transmission in a communication system in accordance with a first embodiment of the present invention. A 4-dimensional (4D) 16-state Wei trellis encoder is being utilized. In this code, single- (2D) and two-symbol (4D) error patterns are dominant, particularly in the presence of signal-dependent impairments such as nonlinear distortion and pulsecode modulation (PCM) noise.

Most single-symbol errors can be detected and corrected by utilizing a single-parity-check (SPC) code. Similarly, most two-symbol errors can be detected and corrected using a second SPC code. In what follows, the length of an SPC code will be denoted as L, measured in number of N-dimensional symbols, N being the dimensionality of the trellis code. We will also refer to L as the frame size of the SPC code. In this embodiment, both SPC's are assumed to be of length L=8. This means, for each SPC, one parity bit will be added every L=8 4D symbols. The frames of the two SPC's may be aligned, meaning they start in the same 4D symbol interval, or they may be offset with respect to one another. In what follows, unless indicated otherwise, the SPC frames will be assumed to be aligned.

The trellis encoder in FIG. 1 is arranged for sending 110 data bits for every L=8 4D symbols, or 13.75 bits per 4D symbol on average. With the addition of two parity bits every 8th 4D symbol for SPC's, the total number of bits transmitted becomes 112/8=14 bits per 4D symbol. These input bits are indicated in FIG. 1 as Q1, Q2, ..., Q14. Although FIG. 1 shows the implementation using a specific mapping scheme utilizing a block encoder (102), clearly the present invention may also be utilized with other mapping schemes such as shell mapping. The remaining elements of FIG. 1 will be described later.

Figure 2:
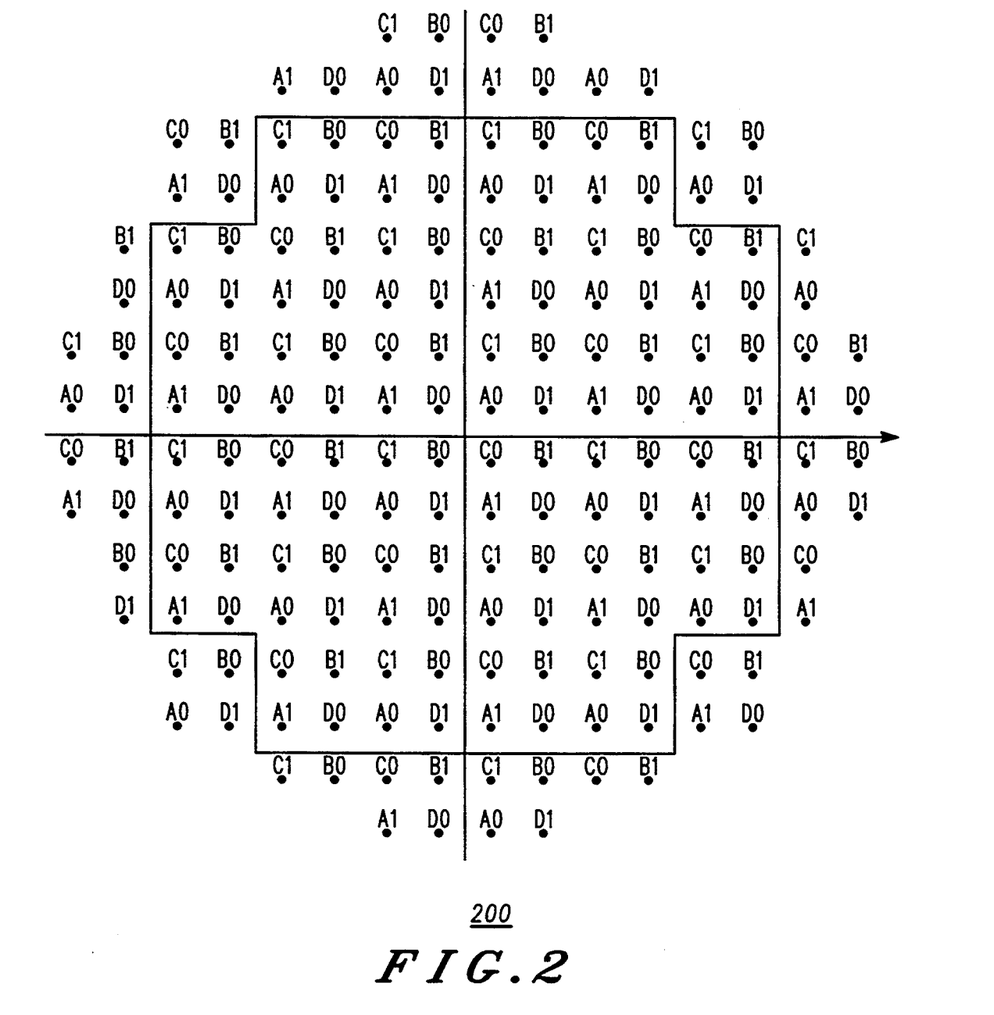
FIG. 2, numeral 200, illustrates a two-dimensional signal constellation with 192 points, that is utilized in a first embodiment in accordance with the present invention.

FIG. 2, numeral 200, illustrates a 2D signal constellation with 192 points. In a first embodiment in accordance with the present invention, 2D signal points will be selected from this signal constellation. This constellation is partitioned into four subsets which are labelled as A, B, C and D. These subsets are further partitioned into even (0) and odd (1) types (e.g., A0, A1, B0, B1, etc.) such that, for an even 2D signal point, the nearest 2D signal point in the same subset is odd.

Figure 3:
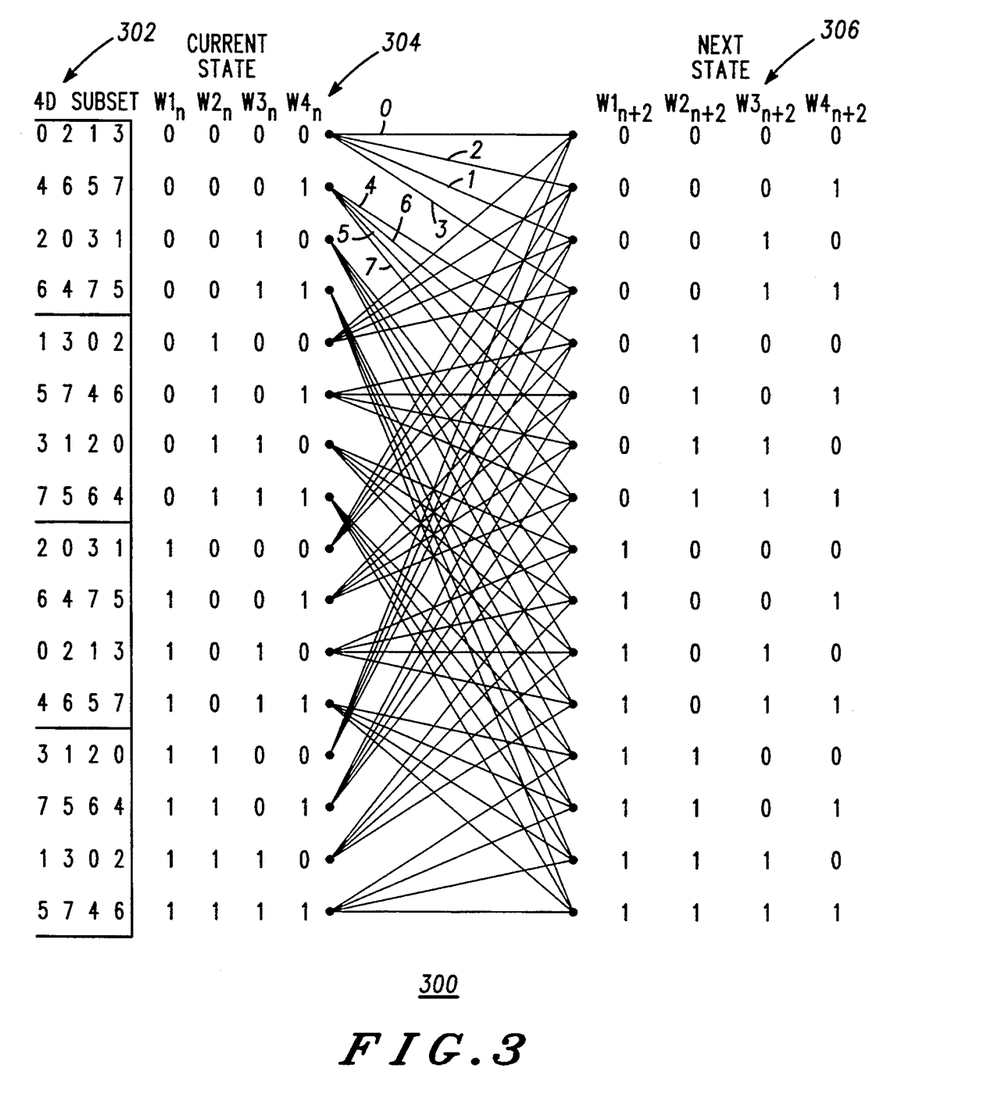
FIG. 3 illustrates a trellis diagram of the 4D 16-state Wei code.

It is possible to describe the parallel transition errors using lattice terminology. The 4D 16-state Wei trellis code is based on a 4D 8-way lattice partition $Z^4/RD_4$. Here $Z^4$ is the set of all integer 4-tuples, where the signal points are chosen from the translate $Z^4 + (0.5, 0.5, 0.5, 0.5)$, and $RD_4$ is a sublattice of $Z^4$ whose signal points are either of the type (A, A) or (B, B), where A and B indicate the 2D subsets shown in FIG. 2. The lattice $RD_4$ has 8 cosets (translates) whose union form the lattice $Z^4$. These cosets can be specified by a pair of 2D subsets (e.g., A, A), as shown in Table 1. The trellis diagram of the 4D 16-state Wei code can then be drawn as shown in FIG. 3, numeral 300, wherein the transitions from a current state (304) to a next state (306) are associated with a particular 4D subset (302). The trellis diagram represents all sequences of cosets of $RD_4$ that belong to the trellis code.

TABLE 1

| 4D SUBSETS | |
|---|---|
| 4D Subset | Subset Types |
| 0 | (A,A) or (B,B) |
| 1 | (C,C) or (D,D) |
| 2 | (A,B) or (B,A) |
| 3 | (C,D) or (D,C) |
| 4 | (A,C) or (C,A) |
| 5 | (C,B) or (B,C) |
| 6 | (A,D) or (D,A) |
| 7 | (C,A) or (D,B) |

It can be seen that if a transmitted 2D symbol is in some 2D subset (e.g., A0), and a received 2D signal point is closer to a nearest incorrect 2D symbol in the same 2D subset (e.g., A1), a minimum-distance single-symbol error will occur, where the incorrect symbol is of a different (even/odd) type than the correct 2D symbol. Similarly, if a transmitted 4D symbol belongs to some 4D subset type [e.g., (A,A)] and a received 4D signal point is closer to a nearest incorrect 4D symbol that belongs to a different 4D subset type [e.g., (B,B)], a minimum-distance two-symbol error will occur. That these errors are minimum-distance errors can be seen by examining the entire distance structure of this code.

The transmitter shown in FIG. 1 encodes data mostly as in the original Wei code, and additionally, it separately monitors the mod-2 sum of the bits Q3 and Q4 within the SPC frames. At the end of an SPC frame of L=8 4D symbols, the transmitter chooses the bits Q3 and Q4, as parity bits (replacing data bits) so that the mod-2 checksum over the entire SPC frame is equal to a pre-specified binary value. For example, the checksum can always be forced to 0 (or 1), or it can vary according to a periodic pre-specified binary sequence. For frame synchronization, this binary sequence can be chosen from a linear cyclic block code whose minimum Hamming distance is as large as possible.

The redundancy of each SPC parity bit is $\frac{1}{8}$ bit per 4D symbol, giving a total coding gain penalty of approximately $2 \times 1.5/8 = 0.38$ dB, assuming 1 additional bit per 4D costs 1.5 dB.

Now the encoder will be described in more detail. Data bits Q1 through Q14 determine a 4D signal point which will be transmitted as two successive 2D signal points. Data bits Q1 and Q2 are convolutionally encoded in a 16-state convolutional encoder (106) to yield an additional coded bit Y0. Q1, Q2 and Y0 then determine the 4D subset, and Q3 determines the odd/even type of the 4D subset explained above, as indicated in Table 2. The data bit Q4 determines the mod-2 sum of the odd/even types of the two 2D signal points in the 4D symbol interval.

TABLE 2

| | | | | FIRST BIT CONVERTER | | | | | |
|---|---|---|---|---|---|---|---|---|---|
| 4D Subset | Y0(n) | Q1(n) | Q2(n) | Q3(n) | 4D Types | Z0(2n) | Z1(2n) | Z0(2n + 1) | Z1(2n + 1) |
| 0 | 0 | 0 | 0 | 0 | (A,A) | 0 | 0 | 0 | 0 |

TABLE 2-continued

| | | | FIRST BIT CONVERTER | | | | | |
|---|---|---|---|---|---|---|---|---|
| 4D Subset | Y0(n) | Q1(n) | Q2(n) | Q3(n) | 4D Types | Z0(2n) | Z1(2n) | Z0(2n + 1) | Z1(2n + 1) |
| | 0 | 0 | 0 | 1 | (B,B) | 0 | 1 | 0 | 1 |
| 1 | 0 | 0 | 1 | 0 | (C,C) | 1 | 0 | 1 | 0 |
| | 0 | 0 | 1 | 1 | (D,D) | 1 | 1 | 1 | 1 |
| 2 | 0 | 1 | 0 | 0 | (A,B) | 0 | 0 | 0 | 1 |
| | 0 | 1 | 0 | 1 | (B,A) | 0 | 1 | 0 | 0 |
| 3 | 0 | 1 | 1 | 0 | (C,D) | 1 | 0 | 1 | 1 |
| | 0 | 1 | 1 | 1 | (D,C) | 1 | 1 | 1 | 0 |
| 4 | 1 | 0 | 0 | 0 | (A,C) | 0 | 0 | 1 | 0 |
| | 1 | 0 | 0 | 1 | (B,D) | 0 | 1 | 1 | 1 |
| 5 | 1 | 0 | 1 | 0 | (C,B) | 1 | 0 | 0 | 1 |
| | 1 | 0 | 1 | 1 | (D,A) | 1 | 1 | 0 | 0 |
| 6 | 1 | 1 | 0 | 0 | (A,D) | 0 | 0 | 1 | 1 |
| | 1 | 1 | 0 | 1 | (B,C) | 0 | 1 | 1 | 0 |
| 7 | 1 | 1 | 1 | 0 | (C,A) | 1 | 0 | 0 | 0 |
| | 1 | 1 | 1 | 1 | (D,B) | 1 | 1 | 0 | 1 |

The bits Q3, Q2, Q1 and Y0 enter a first bit converter (108), that operates in accordance with Table 2, set forth above. The outputs Z1(2n) Z0(2n) and Z1(2n+1) Z0(2n+1) of the bit converter select one of four subsets A=00, B=01, C=10, and D=11 for the signal points transmitted in symbol intervals 2n and 2n+1, respectively.

As illustrated in FIG. 1, two bits, Q4 and Q5, enter a second bit converter (104) which produces the bits Z2(2n) and Z2(2n+1), as illustrated in Table 3 below. These bits determine the odd/even type of the 2D signal points.

TABLE 3

| | 2ND BIT CONVERTER | | |
|---|---|---|---|
| Q4 | Q5 | Z2(n + 1) | Z2(n) |
| 0 | 0 | 0 | 0 |
| 0 | 1 | 1 | 1 |
| 1 | 0 | 0 | 1 |
| 1 | 1 | 1 | 0 |

Finally, 3 bits Q6, Q7 and Q8 enter a rate-$\frac{3}{4}$ block coder (102) to produce the bits Z4(2n+1) Z3(2n+1) and Z4(2n) Z3(2n), as illustrated in Table 4, set forth below. The signal constellation in FIG. 2 is also partitioned into an inner region with 128 points and an outer region with 64 points. The bits Z4 Z3 select between the inner and outer regions, where a 10 selects an outer region, and 00 and 01 select the inner region. Note that Z4 Z3 never take the value 11; therefore, within a 4D symbol, two outer points are never used.

TABLE 4

| | | | 4D BLOCK ENCODER | | | |
|---|---|---|---|---|---|---|
| Q6 | Q7 | Q8 | Z3(2n) | Z4(2n) | Z3(2n + 1) | Z4(2n + 1) |
| 0 | 0 | 0 | 0 | 0 | 0 | 0 |
| 0 | 0 | 1 | 0 | 0 | 0 | 1 |
| 0 | 1 | 0 | 0 | 0 | 1 | 0 |
| 0 | 1 | 1 | 0 | 1 | 1 | 0 |
| 1 | 0 | 0 | 1 | 0 | 0 | 0 |
| 1 | 0 | 1 | 1 | 0 | 0 | 1 |
| 1 | 1 | 0 | 0 | 1 | 0 | 0 |
| 1 | 1 | 1 | 0 | 1 | 0 | 1 |

Together with the remaining 6 bits [Q9—>Z5(2n), Q10—>Z6(2n), Q11 —>Z7(2n), Q12—>Z5(2n+1), Q13—>Z6(2n+1), Q14 —>Z7(2n+1)], the 8-bit indices Z0(k)Z1(k)Z2(k)Z3(k)Z4(k)Z5(k)Z6(k)Z7(k) are formed, where k=2n and k=2n+1, which specify the signal points to be transmitted. Note that the labelling is such that the bits Z2(2n) and Z2(2n+1) select between an odd 2D subset (e.g., A1) and an even 2D subset (e.g., A0). For example, if Z1(2n) Z0(2n) =00, and Z2(2n)=0, then the signal point in the symbol interval 2n will be selected from the subset A0 (an even 2D subset). On the other hand, if Z2(2n)=1, then the signal point will be selected from the subset A1 (an odd 2D subset). In the present invention, this modified form of labelling is necessary for SPC's.

In the receiver, the 4D 16-state Wei trellis code with the 2 SPC's can be decoded in a variety of ways. One popular method involves two-stage decoding. In two-stage decoding, generally a Viterbi decoder for the 4D 16-state Wei code first decodes the received symbols, and then the decoded parity is checked, separately for the decoded Q3 and the decoded Q4 bits.

If one single-symbol error is present in the SPC frame, the parity check for Q4 will fail, and the error is detected. To correct this error, the decoder must determine which of the 16 2D symbols in that SPC frame was in error and correct it to the next nearest 2D symbol in the same 2D subset. Thus, the least reliable of the 16 decoded points is determined (that is, which decoded 2D point which is furthest from the corresponding received point), and then is changed to the next closest 2D point in the same 2D subset. A reliability measure for the decoded 2D points and the corresponding second-choice 2D points can be determined and stored in a sequential manner during decoding or this can be done at the end of the SPC frame when a parity failure occurs.

Similarly, if one two-symbol error is present in the SPC frame, the parity check for Q3 will fail, and the error is detected. Again to correct the error, the decoder must determine which of the 8 4D symbols in that SPC frame was in error and correct it to the next nearest symbol in the same 4D subset. Thus, the least reliable of the 8 decoded 4D points is determined (that is, the decoded 4D point which is furthest from the corresponding received 4D point), and then is changed to the next closest 4D point in the same subset. Again, the reliability of the least reliable 4D point and the corresponding second-choice 4D point can be determined and stored in a sequential manner during decoding or this can be done once at the end of the frame when a parity failure occurs.

It is also possible to decode the trellis code and the SPC's jointly. In this case, the decoder will directly take into account the known parity-check bits at the end of frame boundaries to provide better performance. In joint decoding, the decoder operates using a trellis that has more states (e.g., 64) than the number of states in the trellis code (e.g., 16). This is done by defining the states as a concatenation of the states of the trellis code and the accumulated checksum(s). At the boundaries of SPC frames, states which correspond to invalid checksums are eliminated, for example, by setting their distance metrics equal to a large value. In joint decoding, the decoder will only search among sequences that satisfy the checksum conditions.

Now it can be described how the receiver can monitor frame synchronization by utilizing the parity bits of the SPC's without any additional cost in performance in the present invention, the encoded 4D symbols are framed in two ways. The first are the SPC frames which are L 4D symbols long. The second are the primary frames which are F 4D symbol long, where F may be different from L. As mentioned earlier, the primary frames may be imposed by a multiplexer or a fractional bit per symbol mapping algorithm. It should be emphasized that the receiver needs to maintain synchronization with respect to both types of frames.

To illustrate the primary frames further, a specific example will now be given using a multiplexer: utilizing the system described so far, 22 kbit/s of data can be sent at a symbol rate of 3200 bits/s ($3200 \times 6.875 = 22,000$). To multiplex two data sources of rates 21.6 kbit/s and 400 bit/s, time-division multiplexing can be used with a primary frame size of F=55 4D symbol intervals. For 54 4D symbol intervals, the encoder will pick the data bits Q1, . . . , Q14 from the data source of rate 21.6 kbit/s, and in the 55th 4D symbol interval, the encoder will pick the data bits from the data source of rate 400 bit/s.

To decode the SPC codes correctly, the decoder must know where the SPC parity bits are within the SPC frame. Similarly, to correctly de-multiplex the data stream, the receiver must know the position of the primary frame boundaries every F symbols, so that it can correctly determine where the bits are for the 400 bit/s channel. If the channel delay suddenly changes, the receiver may loose synchronization. Then, wrong bits may be delivered to wrong data sinks, or the decoder will start making unnecessary errors. Therefore, it is imperative that a loss of frame sync be rapidly detected and corrected.

In what follows, initially only the first SPC (which corrects single-symbol errors) will be utilized for frame synchronization. It is also possible to use the second SPC, or to improve efficiency, both can be utilized simultaneously, as will be explained later.

First, the simpler case where the SPC frame size L is equal to the primary frame size F will be considered. Here if frame synchronization is lost, in a two-stage decoder, at the output of the (first-stage) Viterbi decoder (prior to second-stage SPC decoding), in the absence of other errors, a parity check will fail with about 50% probability. Therefore, loss of frame synchronization can quickly be detected by monitoring the parity failure rate at the output of the Viterbi decoder. Furthermore, by keeping a sliding window of parity failure rates for L possible frame positions, frame synch can be reacquired by selecting the frame position which produces the smallest failure rate.

If the receiver is utilizing a single-stage decoder which decodes the trellis code and the SPC's jointly, then the mechanism which monitors parity failures must examine the internal variables of the decoder to determine the loss of frame synchronization. This can be done, for example, by comparing the accumulated metrics of valid states with those of invalid states at SPC frame boundaries. Frame sync can be reacquired, again, by monitoring the difference between valid and invalid states, for all possible frame positions.

In the more general case, where L and F are different, first an integer K is determined, which is the smallest common integer multiple of the frame sizes L and F, where $K \geq L$ and $K \geq F$. Then at boundaries of SPC frames, the parity bit is chosen such that the checksum of the odd/even bit (Q4) corresponds to a periodic sequence with period K/L, which is determined a priori. For example, when F=55 and L=8, as in the above example, K can be chosen as $K = 55 \times 8 = 440$, and the period of the checksum bit will be 55. In case of a loss of frame synchronization, the parity check will again fail with about 50% probability, and can be detected by monitoring the parity failure rate. Again, it is possible to reacquire frame alignment by keeping a sliding window of parity failure rates for K possible frame positions, and selecting the frame position with the smallest failure rate.

In the special case, where the primary frame size F is an integer multiple of the SPC frame size L, K can be chosen equal to F. On the other hand, if the primary frame size F is an integer submultiple of L, K can be chosen equal to L.

In practice, it is often desirable to detect and correct the loss of frame synchronization as quickly as possible. Therefore, where possible, one should choose the frame sizes L and F, so that their smallest common integer multiple K is as small as possible. This will also help reduce the complexity for monitoring the parity failure rate for all frame positions, which is needed for reacquiring frame synchronization.

It is also possible to reduce the detection time by making use of both SPC codes. When both SPC's are used, in case of a loss of frame synchronization, in the absence of other errors, at least one parity failure will occur with 75% probability. This will help speed up the detection of loss of frame synchronization.

Alternatively, by offsetting the SPC frames by L/2 symbols with respect to one another, and using a pseudo-random pattern for the checksums, defined jointly for both SPC's, the value of K can be reduced by 50%. For example, if F=55 and L=8, by utilizing both SPC's, a frame sync check is possible every 4 4D symbols. Therefore, the effective value of L is now 4, and the smallest common integer multiple of L and F is now 220, which is reduced by 50% from 440.

Figure 4:
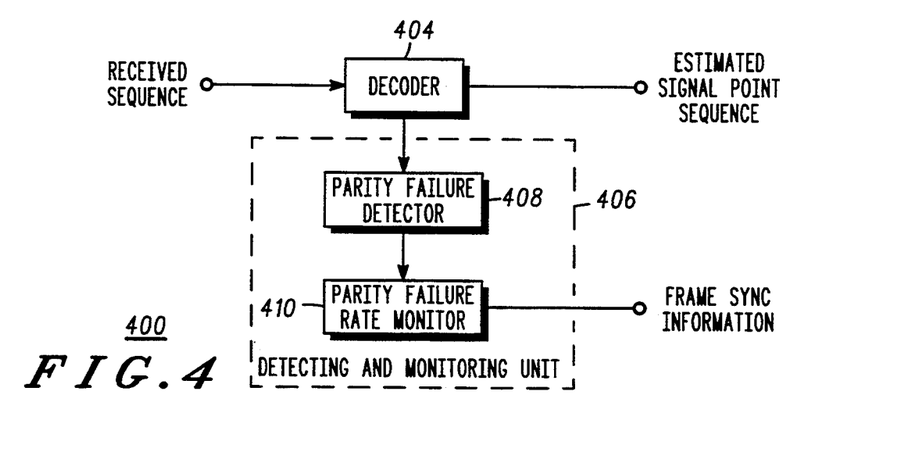
FIG. 4 sets forth a block diagram of a device that facilitates frame synchronization in a receiver in accordance with the present invention.

FIG. 4, numeral 400, sets forth a block diagram of a device that, in accordance with the present invention, facilitates frame synchronization in a receiver in a communication system. Typically, a transmitter sends a sequence of signal points having at least a first parity bit at the end of every SPC frame which are L 4D symbols long. The signal points are drawn from a constellation of available signal points such that said sequence is one of a set of permissible sequences that is smaller than the set of all possible sequences of said signal points. The sequence of signal points are further organized as a series of primary frames, each primary frame beginning at a predetermined time and lasting F 4D symbol intervals.

The receiver determines a predetermined time when each said primary frame ends in order to maintain primary frame synchronization with said transmitter. The device of the present invention comprises at least a decoder (404) and a detecting and monitoring unit (406). The decoder (404) receives a noisy and/or distorted version of the transmitted sequence, which will be called the received sequence, and estimates the transmitted signal points. The decoder (404) decodes the trellis-code, including the 2 SPC's. The decoder can be a two-stage decoder or a single-stage decoder, or a combination of two, or may ignore one or both of the SPC's. The detecting and monitoring unit (406) is operably coupled to the decoder, and at least determines a rate of occurrence of parity failure.

In accordance with the present invention, the constellation is partitioned into a plurality of subsets such that the selection of the signal points from the subsets is governed by a SPC code. The present invention utilizes the parity check bits already present in the SPC codes to facilitate frame synchronization.

In a first embodiment, the multi-dimensional trellis coded communication system is a 4D 16-state trellis coded communication system with 2 SPC's.

The detecting and monitoring unit (406) for determining a rate of occurrence of parity failure includes at least a parity failure detector (408) and a parity failure rate monitor (410). The parity failure detector (408) is operably coupled to the decoder to determine parity failures. Where said parity failure rate is greater than or equal to a predetermined rate over a predetermined time interval, the monitor declares a loss of frame synchronization.

Figure 5:
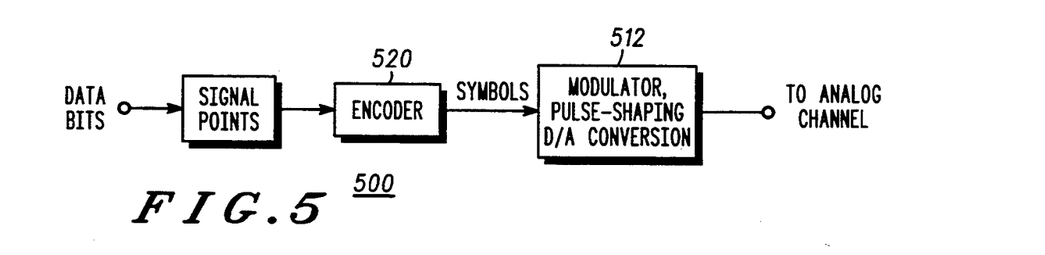
FIG. 5 sets forth a block diagram of a transmitter of a system for maintaining frame synchronization in a multidimensional, multi-level trellis coded communication system in accordance with the present invention.
Figure 6:
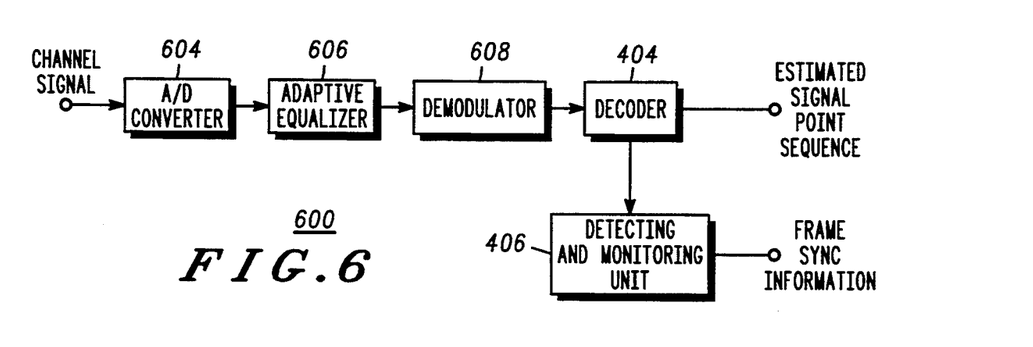
FIG. 6 sets forth a block diagram of a receiver of a system for maintaining frame synchronization in a multidimensional, multi-level trellis coded communication system in accordance with the present invention.

As illustrated in FIGS. 5 and 6, numerals 500 and 600, respectively, a device of the present invention may be utilized for detecting and correcting a loss of a frame synchronization in a trellis coded communication system with SPC's. The communication system typically comprises at least a transmitter (500) that sends a sequence of signal points which include information about a first parity check bit in successive SPC frames, said signal points being drawn from a constellation of available signal points such that said sequence is one of a set of permissible sequences that is smaller than the set of all possible sequences of said signal points, said sequence of signal points being organized as a series of frames, each frame beginning at a predetermined time. A S/P converter accepts data bits from one or more data sources and passes them in groups to an encoding unit (520) which is operably coupled to receive data bits from one or more data sources, encodes these data bits into a sequence of signal points, where the encoding also involves the addition of parity-check bits for the purpose of correcting at least some of the parallel transition errors. These signal points are then fed into a modulator, a pulse-shaping filter and a D/A converter (512) that outputs a signal to the analog channel. In one preferred embodiment, the encoding unit (520) can be realized as the element (100) in FIG. 1.

The system further includes a receiver (600) that determines said predetermined time when each said frame begins in order to maintain frame synchronization with said transmitter. The receiver typically comprises, operably coupled in serial fashion, an ND converter (604), an adaptive equalizer (606), an adaptive demodulator (608), a decoder (404) and a frame synchronization monitoring unit (406).

The frame synchronization monitoring unit (406) is a device that operates in accordance with the present invention, provides framing information as described more fully above.

Figure 7:
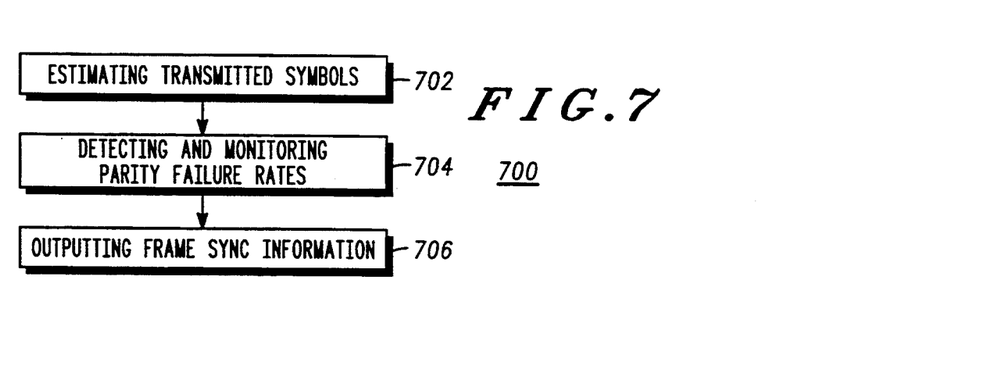
FIG. 7 is a flow chart of the steps of a method in accordance with the present invention.

FIG. 7, numeral 700, is a flow chart showing the steps in accordance with the method of the present invention. The method provides for facilitating frame synchronization in a receiver in a communication system wherein a transmitter sends a sequence of signal points as described above for the device of the present invention (FIG. 4). The method comprises at least the steps of estimating the transmitted signal points (702), and detecting and monitoring a rate of occurrence of parity failure (704). Again, in a first embodiment, the trellis coded communication system utilizes a 4D 16-state trellis coded communication system with 2 SPC's.

In accordance with the device operation, the method may be selected to detect and monitor a rate of occurrence of parity failures and determine the parity failure rate, and where said rate is greater than or equal to a predetermined rate over a predetermined time interval, declaring a loss of frame synchronization; and Although the preferred embodiment described in this specification used the 4D 16-state Wei code, the invention is also applicable to other trellis codes with SPC's. For example, it can be used with 4D 32- state or 4D 64-state Wei-type codes. It can also be used with codes of other dimensionality (e.g., N=2 or N=8). It is also possible to utilize the invention with multi-level codes other than SPC's, or it can be utilized with other coded modulation systems.

I claim:

1. A device for facilitating frame synchronization in a communication receiver to reliably receive a sequence of signal points sent from a transmitter wherein the transmitter selects the signal points using a convolutional code and at least one parity-check code arranged as a multi-level trellis code, said sequence of signal points being organized as a series of frames, and wherein the receiver must maintain frame synchronization with said transmitter, said device comprising:

a decoder for the multi-level trellis code, operably coupled to receive said sequence of signal points, for estimating the transmitted signal points using a decoder for the convolutional code, but without taking into account at least one of the parity-check codes, and     means for detecting an output of the decoder and monitoring how often estimated signal points fail to satisfy the parity of said parity-check codes,     means for determining frame synchronization based on how often estimated signal points fail to satisfy the parity of said parity-check codes.

2. The device of claim 1 wherein the communication system is a 4 dimensional (4D) 16-state trellis coded communication system with two single parity check codes.

3. A system for maintaining frame synchronization in a communication receiver of a multi-level trellis coded communication system, said communication receiver for reliably receiving a sequence of signal points sent from a transmitter and wherein the receiver must maintain frame synchronization with said transmitter     the transmitter being utilized for selecting the signal points using a convolutional code and at least one parity-check code arranged as a multilevel trellis code, the sequence of signal points being organized as a series of frames, and     the receiver being utilized for determining a predetermined time when each frame begins in order to maintain frame synchronization with said transmitter, said system comprising:

a decoder, operably coupled to receive said sequence of signal points, for estimating transmitted signal points, and means for detecting an output of the decoder and monitoring how often estimated signal points fail to satisfy the parity of said parity-check codes, means for determining frame synchronization based on a rate of occurrence of parity failures.

4. The system of claim 3 wherein the multi-level trellis coded communication system utilizes a 4 dimensional, 4D, 16-state trellis coded communication system.

5. A method for facilitating frame synchronization in a communication receiver in a communication system for reliably receiving a sequence of signal points sent from a transmitter wherein the transmitter selects the signal points using a convolutional code and at least one parity-check code arranged as a multi-level trellis code, the sequence of signal points being organized a series of frames, and wherein the receiver must maintain frame synchronization with said transmitter, said method comprising the steps of:

estimating transmitted signal points, and detecting and monitoring how often estimated signal points fail to satisfy the parity of said parity-check codes, determining frame synchronization based on a rate of occurrence of parity failures.

6. The method of claim 5 wherein the communication system is a 4 dimensional (4D) 16-state trellis coded communication system.

* * * * *